United States Patent [19]

Chang et al.

[11] Patent Number: 5,369,610
[45] Date of Patent: Nov. 29, 1994

[54] STATIC MEMORY WITH IMPROVED WRITE-RECOVERY

[75] Inventors: Tung C. Chang, Hsin-chu, Taiwan, Prov. of China; Wei Chen, Saratoga, Calif.

[73] Assignee: United Microelectronics Corporation, Hsinchu, Taiwan, Prov. of China

[21] Appl. No.: 157,401

[22] Filed: Nov. 26, 1993

[51] Int. Cl.$^5$ .............................................. G11C 7/00
[52] U.S. Cl. ...................... 365/189.01; 365/190; 365/230.06; 365/230.08
[58] Field of Search ............. 365/189.01, 190, 230.08, 365/230.06

[56] References Cited
U.S. PATENT DOCUMENTS 5,070,482 12/1991 Miyaji ........................... 365/230.06
5,267,197 11/1993 McClure ........................ 365/189.01
5,285,414 2/1994 Yamauchi ..................... 365/189.01

Primary Examiner—Eugene R. LaRoche
Assistant Examiner—Son Mai
Attorney, Agent, or Firm—George O. Saile; William S. Robertson

[57] ABSTRACT

An improved circuit is provided for extending the write-recovery time of a high speed memory into the next memory access cycle. In the preferred embodiment, the address buffer circuits turn off at a suitable high rate for read but are controlled to turn off more slowly for a write and to thereby extend the write select signal. In a specific address buffer circuit, FETs are supplied a reduced drain-source current during write and thereby are made to switch at a suitably slower speed.

18 Claims, 3 Drawing Sheets

STATIC MEMORY WITH IMPROVED WRITE-RECOVERY

FIELD OF THE INVENTION

This invention relates generally to static information storage devices, and more specifically it relates to a circuit that improves the operation of write-recovery that is a final part of the operation of writing a data bit into a binary storage cell.

INTRODUCTION

Static memories are well known but it will be helpful to review the features and terminology that particularly apply to this invention.

The Array

These memories are organized as arrays of storage cells located at cross-over points of row lines and column lines. The specific memory that will be described later has one array for each bit position in the memory word. On each read or write operation a single cell in each array is selected by operations on the row and column lines.

The row lines are commonly called word lines because they take part in the process of selecting the memory word to be accessed. In these memories, the column lines also take part in the process of selecting the memory word to be accessed, but they are commonly called bit lines because they carry the data that is to be written into a cell or is read from a cell.

In the preferred array, the bit lines are arranged in pairs because the binary states of a storage cell are represented by an up level on one or the other of the two lines, as is typical of memories with a fast cycle time. (The other line has a down level.) Some arrays represent binary data by a voltage or the absence of a voltage on a single line. Since the invention may be useful with other arrays, the term bit line will ordinarily mean either a single line or a pair of lines, as appropriate for a particular array. The phrase bit line pair will be used for describing a specific feature of the preferred array.

A unit of several arrays holds each bit position of a memory word. Certain address bits are decoded to select a particular column of each array and certain other bits are decoded to select a particular row in each array. Several of these units can be combined to provide a larger memory, and other address bits may select one of these multi-array units.

Write-Recovery

During write operation, the unselected bit lines do not carry data signals and they remain at a predetermined voltage that prevents the associated storage cells from changing state in response to the signal on the selected row line. The selected bit line receives an appropriate voltage to switch the state of the selected storage cell, and the capacitance of the selected line tends to hold this voltage, and the voltage has to be removed so it will not interfere with the next memory access. The operation of discharging the capacitance is called "write-recovery" and it takes place in each write cycle after the storage cell has switched to the state that represents its new data.

SUMMARY OF THE INVENTION

A general object of this invention is to provide an improved write-recovery operation and an improved circuit for this operation.

The invention uses a feature of the prior art that the time for the write-recovery operation is extended into the next cycle.

Memory timing circuits are set conventionally to provide the desired timing for writing data in a cell and for thereafter executing write-recovery. This time can be advantageously set to be longer than a read operation. This invention provides an improved circuit for holding the selection gates open for this extended time.

The address bit buffer circuits conventionally receive each address bit that is supplied to the memory and produce true and complement values that are required in the address decoder circuits. These circuits are modified to produce selection signals of a predetermined length ior read and to produce longer selection signals for write. These circuits are at the narrow end of a tree shaped arrangement of address decoder circuits, and modifying these circuits causes the delayed selection signals to appear in the much larger number of row and column lines of the array.

In the preferred embodiment, the address buffer circuits turn off at a suitable high rate for read but are controlled to turn off more slowly for a write and to thereby extend the write select signal. In a specific address buffer circuit, FETs are supplied a reduced drain-source current during write and thereby are made to switch at a suitably slower speed.

Other features and objects of the invention will appear in the description of the preferred embodiment.

THE DRAWING

THE PREFERRED EMBODIMENT

Figure 4:
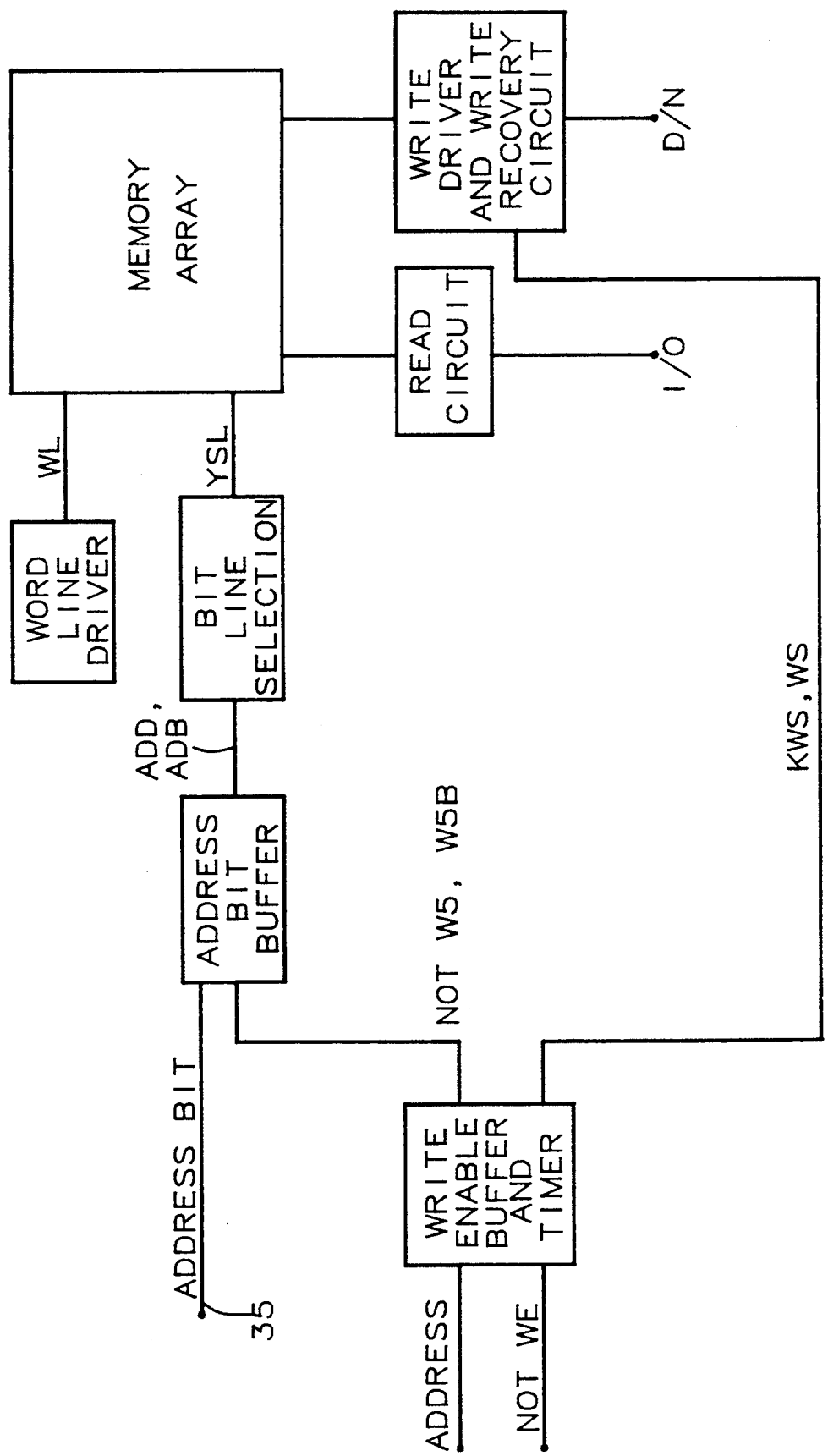
FIG. 4 is a block diagram showing the relation of FIGS. 1 and 3 to conventional memory support circuits and timing circuits that are associated with the timing signals of FIG. 2.

The Memory System of FIG. 4

FIG. 4 shows a memory array, a read circuit, and a write driver and write recovery circuit. These components are shown in detail in FIG. 1 and the blocks that represent these components in FIG. 4 are arranged in the relative positions they have in FIG. 1. A memory data bus carries a multi-bit memory word that is to be written into the array or has been read from the array, and a line I/O shows the path to the read circuit for a read operation. A part of this path for a bit that is to be written in the array is shown in more detail as a line DIN at the input to the write driver and write recovery circuit.

Figure 1:
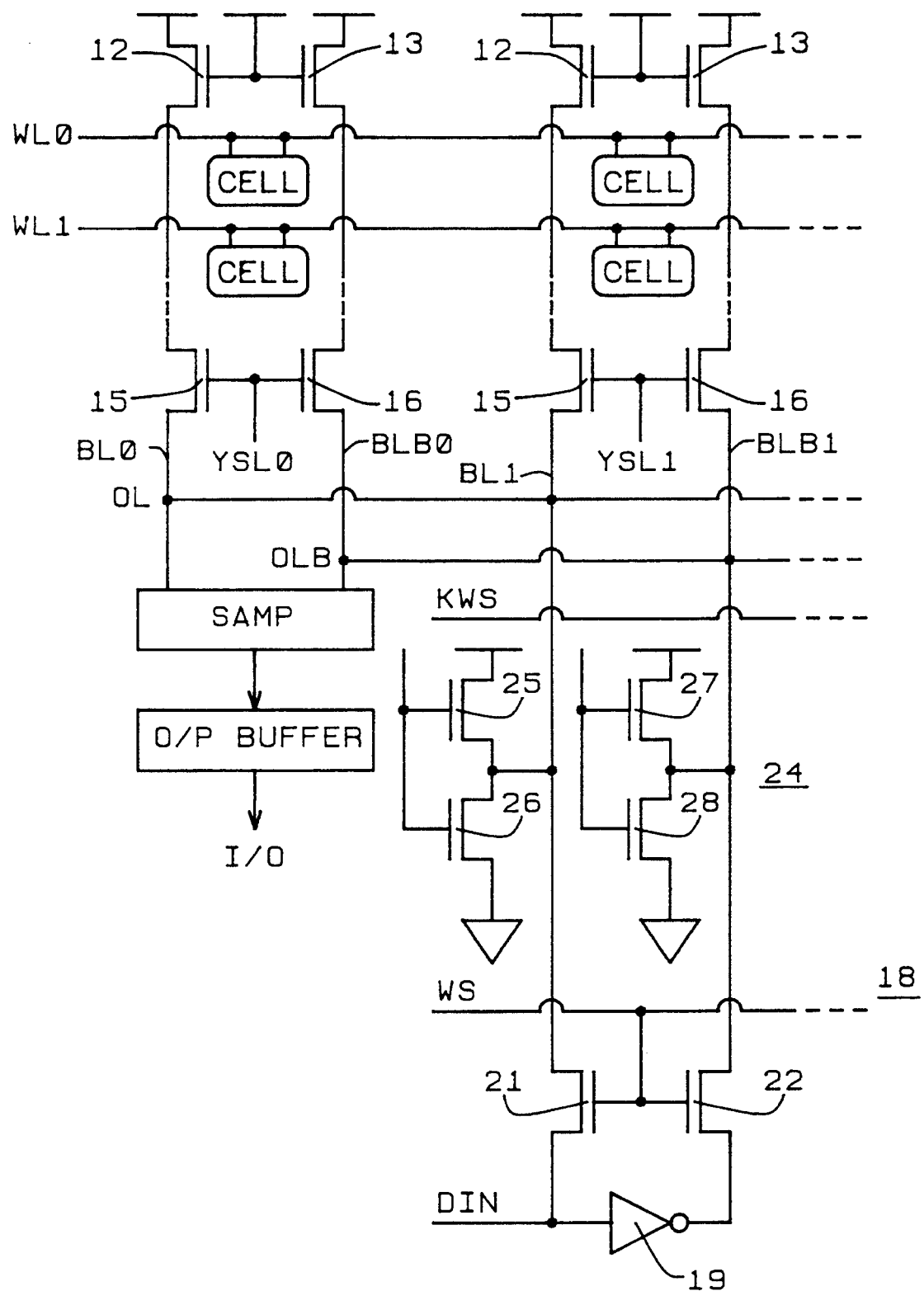
FIG. 1 shows a memory array and associated circuits of a memory using this invention.

Other components shown in FIG. 1 cooperate to decode a multi-bit address and select a multi-bit word location in the array and to provide timing signals for a memory accessing operation. A conventional work line driver responds to particular bit positions of the memory address (not shown) to produce a signal WL for a row (word line) of the array.

A Bit Selection Circuit produces signals YSL, which is derived from other bit positions of the memory address, for addressing along columns of the array. A representative addressing bit appears on a line 30 as an input to an address bit buffer which is shown in detail in FIG. 3. Addressing signals ADD and ADB from the buffer circuit are applied to the Bit Line Selection circuit.

Figure 2:
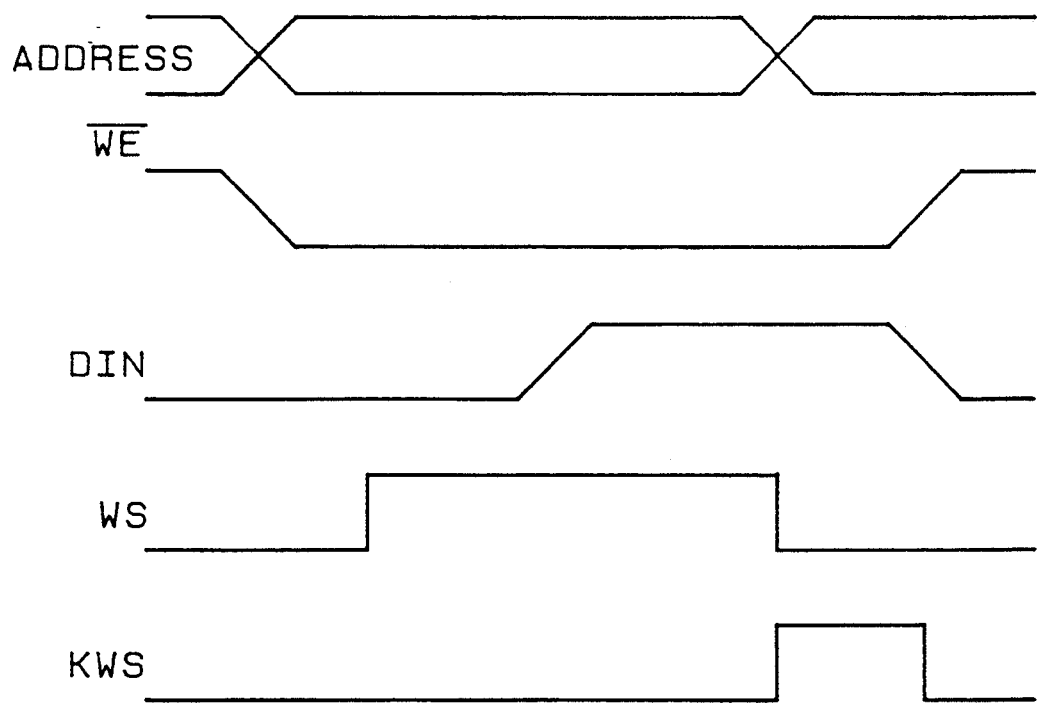
FIG. 2 is timing diagram illustrating the operation of this invention.

Timing signals Not WE and W5B are produced by a Write Enable Buffer, described later. Other timing signals, some of which are shown in FIG. 2, are produced by conventional timing circuits which are grouped with the Write Enable Buffer in FIG. 4. Since the timing sequences for read and write differ, it will be convenient occasionally to refer specifically to write timing or read timing. A signal, Address (signifying that the address bits are valid), is applied to the timing circuit to start a memory access cycle.

Timing circuits commonly have a chain of delay elements, and a starting pulse (the signal Address, described above) causes timing pulses to appear at the taps of the chain at selected intervals as the starting pulse propagates along the chain. Other components of a timing circuit may form particular timing signals from logical combinations of the signals at the delay line taps.

The Array

The preferred array of FIG. 1 produces a single bit output on a line I/O on a read operation, and it stores a single bit that it receives on a line DIN for a write operation. The invention will be useful with various kinds of storage cell, and the cells are shown as functional boxes. The array has one row line for each row of cells. The row lines are designated WL (for "word line") with a numeral suffix, starting with 0 at the top. One of these lines is selected by circuits that decode the related address bits. The array has a pair of column lines for each column of cells. The column line on the left is designated BL (for "bit line") and the column line on the right is designated BLB. These designations have numeral suffixes that start with 0 on the left.

Two FETs 12 and 13 are conventionally connected in lines BL and BLB at the top of each column. Each bit line BL has a series FET 15 that connects it to a node DL (for "data line") and each bit line DLB has a series FET 16 that connects it to a node DLB. FETs 15 and 16 turn on to select the associated bit line and they turn off to isolate an unselected bit line. They receive a selection signal, designated YSL (for "y dimension select line") with the same numeral suffix as the column lines.

The Read Circuits

Nodes DL and DLB carry the data from a selected cell on a read operation, and a sense amplifier SAMP receives these signals and produces a signal at a suitable voltage level for an output buffer circuit and the line I/O.

The Write Driver

The write driver 18 receives a binary valued data bit, (a voltage representing a 0 or a 1) DIN and produces this signal at node DL. An inverter 19 forms the complement at node DLB. Two FETs 21, 22 are each series connected in one of the lines between the driver and nodes DL and DLB, and their gates are connected to be controlled by a signal WS (for "write select"). These gates isolate the write driver from the array during a read operation, and they connect the driver to a bit line pair during a write operation. The driver is also isolated from the array during write-recovery, which begins with the fall of WS.

The Write-Recovery Circuit

A write-recovery circuit 24 has pairs of FETs 25, 26 and 27, 28 connected to conduct in series between the positive power supply terminal and ground to form a voltage divider. The common connection point of each FET circuit forms the mid point of the voltage divider and this point is connected to an associated one of the two nodes DL and DLB. The gates of these FETs are connected to receive a timing signal, KWS. When KWS is up, these FETs turn on and establish a predetermined voltage on the lines and thereby charge the capacitance of the lines. When KWS is down, these FETs are off and do not affect the circuit operation.

Various write-recovery circuits are known, and from a more general standpoint, FETs 25–28 apply a predetermined voltage to the bit line pair to charge the capacitance of the line to a predetermined voltage.

Memory Timing—FIG. 2

A memory cycle for read or write is defined by a signal called Address, which begins when the bits of a memory address are valid at inputs to the array. The address is formed, e.g., from a program instruction in an associated processor. The signal Address can fall to signal the end of one cycle and then rise to begin the next cycle, as FIG. 2 shows.

A timing signal Not WE (for "Not Write Enable") falls at the beginning of a write cycle to enable the write operation (in contrast to a read operation). It rises near the end of the write cycle (when Address falls), and in the memory of this invention it rises after the start of the next memory cycle (read or write) when write-recovery has been completed.

A signal DIN (for "data in") is valid from a midpoint of the write cycle until a suitable point in the next cycle when the previously selected cell has become isolated the from selection circuit enabling voltages. The drawing shows an up level, but it has a binary value to represent a 0 or 1 bit.

The timing signal WS, which controls the write driver, rises after the cell has been selected by the addressing circuits and falls after a sufficient time for the selected cell to switch to its new state.

Signal KWS, which controls write-recovery, rises when WS falls and it falls after a time that is suitable for the write-recovery operation (e.g., 5 nanoseconds).

other timing signals are conventional and will be readily understood. The rise and fall of a signal as shown in the drawing represent the time the signal begins and ends, and the up or down level in the drawing is arbitrary.

Figure 3:
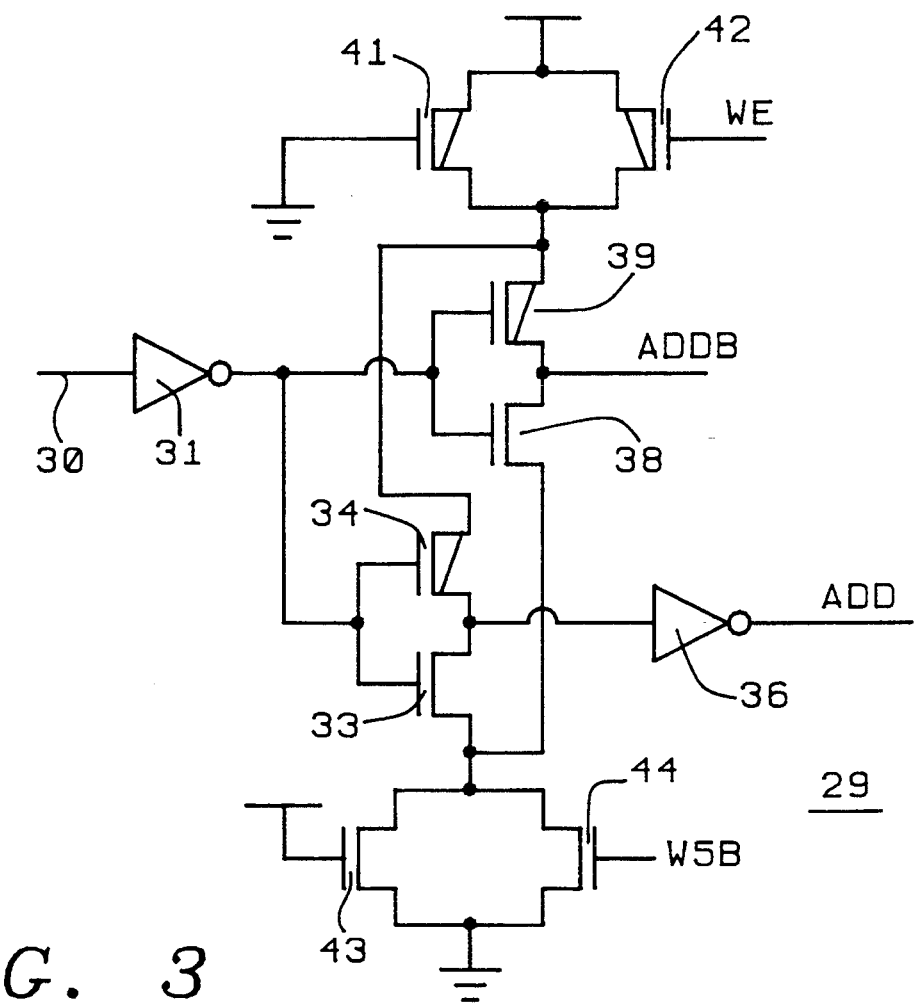
FIG. 3 shows the address bit buffer circuit of one embodiment of this invention.

The Address Buffer Circuit—FIG. 3

The address buffer circuit 29 receives an address bit on a line 30. An inverter 31 is shown to account for the true or complement phase of signals in this Fig. An n-channel FET 33 and a p-channel FET 34 form a conventional inverter that cooperates with an inverter 36 to produce an address bit ADD at the output of this inverter. A similar n-channel FET 38 and p-channel FET 39 form an inverter that produces the complement address bit ADDB. Both true and complement address signals are required by address decoder circuits that are conventional and are not shown in the drawing.

Two p-channel FETs 41 and 42 are connected in parallel between the positive power supply terminal and the p-channel FETs 34, 39 of the inverter circuits. Two n-channel FETs 43 and 44 are connected in parallel between ground and the n-channel FETs 33, 38 of the inverter circuits. These components will be identified as "top" and "bottom" to make the description easier to follow.

The top FET 41 has its gate connected to ground so it always conducts. Similarly, the bottom n-channel FET 43 has its gate connected to the positive terminal so it always conducts. These FETs are small and they conduct a limited current that is suitable for the write-recovery operation, as will be described later.

Conduction by FETs 41 and 43 is not sufficient for the read operation, and FET 42 is connnected in parallel at the top and FET 44 is connected in parallel at the bottom.

The top FET 42 is turned on for read by a timing signal W5 and the bottom FET 44 is turned on for read by a timing signal W5B.

Signals W5 and W5B have the same timing but are complementary in logic value, corresponding to the channel type differences of the FETs. These signals are formed in an otherwise conventional write enable buffer circuit, as will be explained later.

The Address Buffer—Operation

In a read operation, W5 is low and turns on the p-channel FET 42 at the top of the address buffer which conducts in parallel with FET 41. Signal WSB is high and turns on the n-channel FET 44 at the bottom of the address buffer which conducts in parallel with FET 43. The address buffer circuits operate at a normal speed and the read operation has its usual timing.

In a write operation, W5 is high and turns off the p-channel FET 42 at the top of the address buffer, and W5B is low and turns off the n-channel FET 44 at the bottom of the address buffer. The smaller FETs, 41 and 43, conduct a current that has a small value to suitably slow the switching action of the address buffer circuits and thereby keep the selection circuits turned on for a selected time longer than for the read operation.

The write select timing WS is correspondingly extend and the write-recovery timing signal KWS is correspondingly delayed, as shown in FIG. 2.

The Write Enable Buffer Circuit

A conventional write enable buffer receives the signal Not WE shown in the timing diagram and it produces several timing signals, including WS. The write enable buffer circuit has inverters that cause some of the signals to have opposite logic phase (some are up while others are down). The inverters or chains of inverters also produce selected differences in the rise and fall times of the signals.

An inverter is added to the write enable buffer circuit to produce the signal W5T as the complement of WS (with the delay introduced by the inverter). This pulse forming technique is widely used and it is not specifically shown in the drawing.

Word Line Write-Recovery

Write-restore along a selected word line is simpler in the sense that the word line driver (conventional and not shown) puts an enabling voltage on the selected word line and otherwise maintains an inhibiting voltage on an unselected word line. Word line restore takes place conventionally when the word line driver is turned off (as the bit driver turns off at the end of WS) and the selection gates are kept on to allow the selected word line to discharge to the inhibiting voltage level. Preferably, the word line selection circuits include the address buffer of FIG. 3, and word line write-recovery is extended in the way described for bit line write-recovery.

Other Embodiments

The address bit buffer circuit of FIG. 3 can be modified by locating inverter 36 in the input of to the gates of the associated FETs, 33 and 34. Except for the specific features of the invention, these circuits are well known and other modifications will be apparent.

Locating the delay in the address bit driver has the advantage that it is at the starting end of the address decoding tree, but the delay function can be implemented at other levels of the address decoder.

The invention will be useful with memories having various organizations, and suitable modifications will be apparent for adapting the preferred embodiment within the spirit of the invention and the intended scope of the claims.

We claim:

1. A high speed memory comprising
   an array of storage cells and word selection lines and bit selection lines for selecting at least one storage cell of the array for a read or write operation in response to a multi-bit address,
   write timing means for producing a signal (WE) for a write operation,
   a write driver (18) responsive to a data bit (DIN) to be stored for applying a write voltage to the bit line of a selected cell, the write timing means producing a signal (WS) for the write driver,
   write-recovery means (24) for thereafter discharging the selected bit line to a predetermined voltage, the write timing means producing a signal (KWS) for turning on the write-recovery means for a predetermined time, and
   bit line selection means responsive to predetermined address bits for producing bit line selection signals (YSL) for read and write operations,
   wherein an improved means for extending the write-recovery time comprises,
   means located in the bit line selection means for selectively producing a selection signal having a predetermined length or a lengthened selection signal, and
   means responsive to the write timing means for operating the bit line selection means to produce the selection signal of predetermined length during a read operation and to produce the lengthened selection signal during a write operation for extending the write-recovery timing (KWS).

2. The memory of claim 1 wherein the array has one write driver and one cell of the array is selected for read or write.

3. The memory of claim 2 herein the storage cell is a static storage cell and the bit line comprises a pair of lines connected to receive a differential cell voltage during read and wherein the write driver selectively produces complementary signals on the pair of lines representing binary values.

4. The memory of claim 1 wherein the bit line selection means includes an address buffer circuit (29) for each address bit associated with bit line selection.

5. The memory of claim 4 wherein the address buffer circuit includes an inverter circuit and the memory includes means ior producing a signal (W5, WSB) on a read operation to switch the address buffer circuit at a predetermined speed and for producing a signal (Not W5, Not W5B) on a write operation to switch the inverter circuit at a slower speed for delaying the end of the selection process and thereby lengthening the write-recovery period.

6. The memory of claim 5 wherein the address buffer circuit is connected to receive an address bit supplied to the array.

7. The memory of claim 6 wherein the address buffer circuit has means responsive to the signal on a read operation for supplying a predetermined current to operate the address buffer circuit in a fast switching mode and responsive to the signal on a write operation for supplying a smaller current to operate the address buffer circuit with a predetermined switching delay for lengthening the write-recovery period.

8. The memory of claim 7 wherein the means for producing a signal on read and a signal on write comprises means in the write timing means.

9. The memory of claim 8 wherein the write timing means includes a write enable circuit.

10. The memory of claim 7 wherein the address buffer circuit includes a pair of FETs (41, 42) connected in parallel to supply current to the inverter and the means responsive to a read operation comprises means connecting both FETs to turn on and the means responsive to a write operation comprises means connecting only one of the FETs to turn on.

11. The memory of claim 10 wherein the means responsive to a read operation and means responsive to a write operation comprises means providing complementry gate signals on read and write.

12. The memory of claim 11 wherein the pair of FETs is connected between the address buffer circuit and one power supply terminal and the address buffer circuit includes a second pair of FETs (43, 44) connected between the address buffer circuit and the other power supply terminal.

13. The memory of claim 12 wherein one of the FETs (41, 42) of each pair has its gate connected to a fixed potential to turn on the FET.

14. The memory of claim 13 wherein the inverter has a p-channel FET and an n-channel FET and the two FETs of each pair are of the same channel type as the inverter FET to which they are connected.

15. The memory of claim 14 wherein inverter circuit produces one phase of the address bit for subsequent decoding and the address buffer circuit includes a second inverter producing the opposite phase.

16. The memory of claim 8 wherein the array has the address buffer circuit of claim 8 for each address bit supplied to the array.

17. The memory of claim 16 wherein the memory has word line selection circuits and the address buffer circuits for the address bits for word line selection maintain the selected word line selected for discharging the word line during the extended write-recovery period.

18. The memory of claim 1 wherein the means for selectively producing a lengthened signal or a normal signal produces a lengthened signal extending the write circuit timing (WS) into a next cycle time.

* * * * *